United States Patent
Bae et al.

(10) Patent No.: US 12,513,914 B2
(45) Date of Patent: Dec. 30, 2025

(54) SEMICONDUCTOR DEVICE AND METHOD FOR FABRICATING THE SAME

(71) Applicant: SK hynix Inc., Icheon (KR)

(72) Inventors: Young-In Bae, Icheon (KR); Jong Chul Lee, Icheon (KR); Nam Joo Kim, Icheon (KR); Hong Seuk Lee, Icheon (KR)

(73) Assignee: SK hynix Inc., Icheon (KR)

( * ) Notice: Subject to any disclaimer, the term of this patent is extended or adjusted under 35 U.S.C. 154(b) by 395 days.

(21) Appl. No.: 18/058,561

(22) Filed: Nov. 23, 2022

(65) Prior Publication Data

US 2023/0413582 A1    Dec. 21, 2023

(30) Foreign Application Priority Data

Jun. 17, 2022    (KR) .................. 10-2022-0074135

(51) Int. Cl.
*H10B 63/00* (2023.01)
*H10N 70/00* (2023.01)

(52) U.S. Cl.
CPC ........... *H10B 63/84* (2023.02); *H10N 70/021* (2023.02); *H10N 70/883* (2023.02)

(58) Field of Classification Search
CPC .................... H01L 21/0234; H10N 70/826
See application file for complete search history.

(56) References Cited

U.S. PATENT DOCUMENTS

| | | | |
|---|---|---|---|
| 7,160,802 B2 | 1/2007 | Nguyen et al. | |
| 2021/0391536 A1* | 12/2021 | Ando | H10N 70/24 |
| 2023/0064578 A1* | 3/2023 | Tseng | H10B 63/80 |

FOREIGN PATENT DOCUMENTS

| | | |
|---|---|---|
| KR | 10-2011-0083160 A | 7/2011 |
| KR | 10-2013-0109364 A | 10/2013 |
| KR | 10-2013-0135603 A | 12/2013 |
| KR | 10-2016-0076078 A | 6/2016 |
| KR | 10-2019-0004163 A | 1/2019 |

OTHER PUBLICATIONS

Williams et al., Etch Rates for Micromachining Processing, Journal of Microelectromechanical Systems, vol. 5, No. 4, Dec. 1996 (Year: 1996).*

A. Ghumatkar et al., "Influence of Adherend Surface Roughness on the Adhesive Bond Strength", Latin American Journal of Solids and Structures, (2016) 13, 2356-2370, Jun. 27, 2016.

* cited by examiner

*Primary Examiner* — Shih Tsun A Chou

(57) ABSTRACT

A method for fabricating a semiconductor device, may include: providing a substrate; forming a first stacked structure over the substrate, the first stacked structure including a plurality of first lower lines extending in a first direction, a plurality of first upper lines disposed over the first lower lines and extending in a second direction intersecting the first direction, and a plurality of first memory cells respectively disposed at intersection regions between the first lower lines and the first upper lines; forming a first insulating layer filled between the first memory cells and between the first upper lines; forming a first space by recessing the first insulating layer to expose side surfaces of the first upper lines; and forming a second insulating layer having a higher etch resistance than the first insulating layer while filling the first space.

16 Claims, 12 Drawing Sheets

FIG. 12

| | W Only | W+Recess +Cleaning | W+Recess +Cleaning +He Plasma |
|---|---|---|---|
| Contact Angle(°) | <10 | 73.3 | 17.4 |

SEMICONDUCTOR DEVICE AND METHOD FOR FABRICATING THE SAME

CROSS-REFERENCE TO RELATED APPLICATION

This application claims priority under 35 U.S.C. § 119 to Korean Patent Application No. 10-2022-0074135 filed on Jun. 17, 2022, which is incorporated herein by reference in its entirety.

BACKGROUND

1. Technical Field

This patent document relates to memory circuits or devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

In an embodiment, a method for fabricating a semiconductor device, may include: providing a substrate; forming a first stacked structure over the substrate, the first stacked structure including a plurality of first lower lines extending in a first direction, a plurality of first upper lines disposed over the first lower lines and extending in a second direction intersecting the first direction, and a plurality of first memory cells respectively disposed at intersection regions between the first lower lines and the first upper lines; forming a first insulating layer filled between the first memory cells and between the first upper lines; forming a first space by recessing the first insulating layer to expose side surfaces of the first upper lines; and forming a second insulating layer having a higher etch resistance than the first insulating layer while filling the first space.

In another embodiment, a semiconductor device may include: a substrate; a plurality of first lower lines disposed over the substrate and extending in a first direction; a plurality of first upper lines disposed over the first lower lines and extending in a second direction intersecting the first direction; a plurality of first memory cells disposed at intersection regions between the first lower lines and the first upper lines; a first insulating layer pattern filled between the first memory cells; and a second insulating layer pattern disposed over the first insulating layer pattern and filled between the first upper lines while having a higher etch resistance than the first insulating layer pattern.

In another embodiment, a method for fabricating a semiconductor device, may include: forming a tungsten layer; converting a first hydrophilic surface of the tungsten layer into a hydrophobic surface; forming a first portion of an ultra-low temperature oxide (ULTO) layer over the tungsten layer; performing plasma treatment to the first portion of the ULTO layer using a Group VIII inert gas; and forming a second portion of the ULTO layer.

BRIEF DESCRIPTION OF THE DRAWINGS

FIG. 12 is a view showing a change in a surface property of a tungsten layer according to an embodiment.

DETAILED DESCRIPTION

Figure 1A:
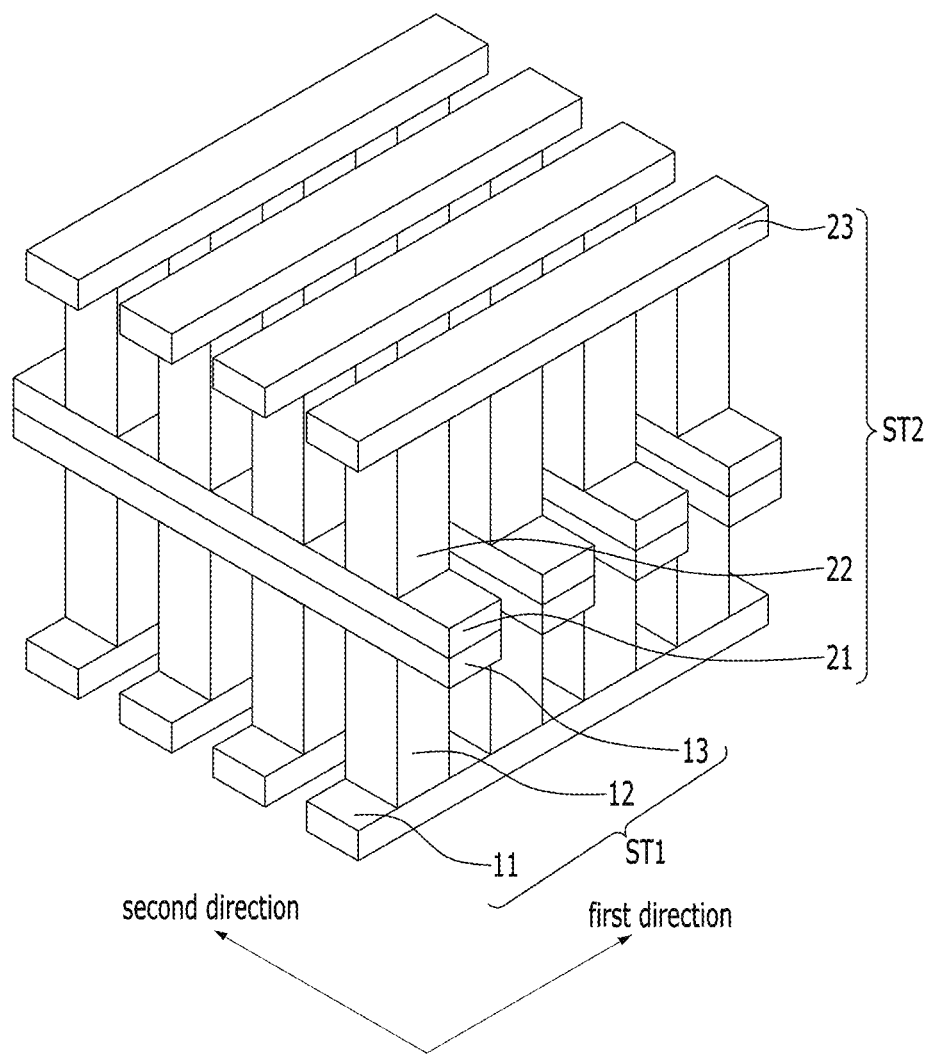
FIG. 1A is a perspective view illustrating a memory device according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
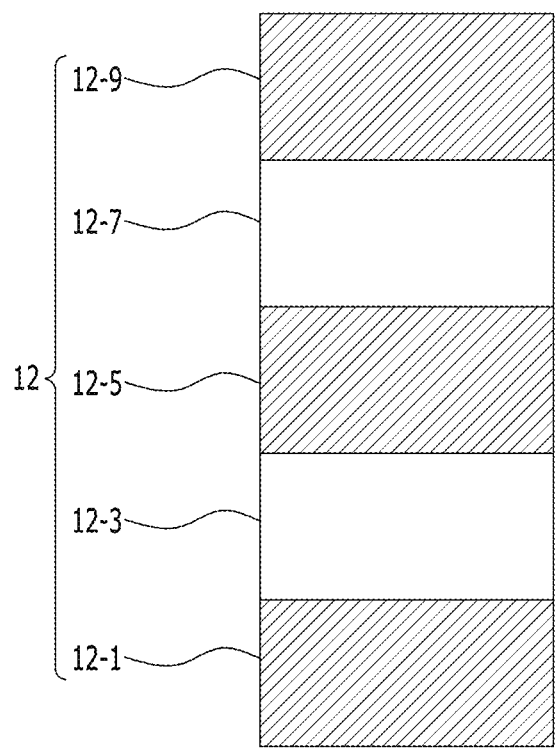
FIG. 1B is a cross-sectional view illustrating an example of a memory cell of FIG. 1A.

FIG. 1A is a perspective view illustrating a memory device according to an embodiment of the present disclosure, and FIG. 1B is a cross-sectional view illustrating an example of a memory cell of FIG. 1A.

First, referring to FIG. 1A, the memory device may include a first stacked structure ST1 and a second stacked structure ST2 sequentially formed over a substrate (not shown) on which a predetermined lower structure is formed.

The first stacked structure ST1 may include a plurality of first lower lines 11 extending parallel to each other in a first direction and spaced apart from each other in a second direction intersecting the first direction, a plurality of first upper lines 13 disposed over the first lower lines 11 while extending parallel to each other in the second direction and spaced apart from each other in the first direction, and a plurality of first memory cells 12 arranged to respectively overlap intersection regions of the first lower lines 11 and the first upper lines 13 between the first lower lines 11 and the first upper lines 13. In other words, the plurality of first memory cells 12 may be disposed at intersection regions between the first lower lines 11 and the first upper lines 13, respectively.

The first memory cell 12 may have a pillar shape. In particular, as shown, the first memory cell 12 may have a rectangular shape having both sidewalls aligned with both sidewalls of the first lower line 11 and both sidewalls of the first upper line 13 in a plan view. However, embodiments of the present disclosure are not limited thereto, and if the first memory cell 12 overlaps the intersection region of the first lower line 11 and the first upper line 13, the planar shape thereof may be variously modified.

The second stacked structure ST2 may include a plurality of second lower lines 21 disposed over the first stacked structure ST1 while extending parallel to each other in the second direction and spaced apart from each other in the first direction, a plurality of second upper lines 23 disposed over the second lower lines 21 while extending parallel to each other in the first direction and spaced apart from each other in the second direction, and a plurality of second memory cells 22 arranged to respectively overlap intersection regions of the second lower lines 21 and the second upper lines 23 between the second lower lines 21 and the second upper lines 23. In other words, the plurality of second memory cells 22 may be disposed at intersection regions between the second lower lines 21 and the second upper lines 23, respectively.

The second memory cell 22 may have a pillar shape. In particular, as shown, the second memory cell 22 may have a rectangular shape having both sidewalls aligned with both sidewalls of the second lower line 21 and both sidewalls of the second upper line 23 in a plan view. However, embodiments of the present disclosure are not limited thereto, and if the second memory cell 22 overlaps the intersection region of the second lower line 21 and the second upper line 23, the planar shape thereof may be variously modified.

The plurality of second lower lines 21 may be disposed to overlap and contact the plurality of first upper lines 13, respectively. The plurality of second upper lines 23 may be disposed to respectively overlap the plurality of first lower lines 11. For example, the plurality of second upper lines 23 may be substantially aligned with the plurality of first lower lines 11, respectively, when seen in a plan view. The plurality of second memory cells 22 may be disposed to respectively overlap the plurality of first memory cells 12. For example, the plurality of second memory cells 22 may be substantially aligned with the plurality of first memory cells 12, respectively, when seen in a plan view.

Each of the first lower line 11, the first upper line 13, the second lower line 21, and the second upper line 23 may include at least one of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof, and may have a single-layer structure or a multilayer structure.

Each of the first memory cell 12 and the second memory cell 22 may include various materials capable of performing a data storage function, and may have various layer structures. As an example, each of the first memory cell 12 and the second memory cell 22 may include a variable resistance material that switches between different resistance states according to an applied voltage or current. As the variable resistance material, at least one of materials used for an RRAM, a PRAM, an MRAM, an FRAM, or the like, that is, a metal oxide such as a perovskite-based oxide or a transition metal oxide, a phase change material such as a chalcogenide-based material, a ferromagnetic material, a ferroelectric material, or the like, may be used. In addition, each of the first memory cell 12 and the second memory cell 22 may have a single-layer structure or a multilayer structure. An example of the multilayer structure will be described in more detail with reference to FIG. 1B.

Referring to FIG. 1B, the first memory cell 12 may have a multilayer structure including a lower electrode layer 12-1, a selector layer 12-3, an intermediate electrode layer 12-5, a variable resistance layer 12-7, and an upper electrode layers 12-9.

The lower electrode layer 12-1 and the upper electrode layer 12-9 may be respectively located at the lower end and the upper end of the first memory cell 12 to transmit a voltage or current required for the operation of the first memory cell 12. The intermediate electrode layer 12-5 may function to electrically connect the selector layer 12-3 and the variable resistance layer 12-7 while physically separating them. The lower electrode layer 12-1, the intermediate electrode layer 12-5, or the upper electrode layer 12-9 may include at least one of various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, one or more of the lower electrode layer 12-1, the intermediate electrode layer 12-5, and the upper electrode layer 12-9 may include a carbon electrode.

The selector layer 12-3 may function to substantially prevent current leakage that may occur between the first memory cells 12 sharing the first lower line 11 or the first upper line 13. To this end, the selector layer 12-3 may have a threshold switching characteristic, that is, a characteristic for substantially blocking or limiting current when a magnitude of an applied voltage is less than a predetermined threshold value and for allowing current to abruptly increase above the threshold value. The threshold value may be referred to as a threshold voltage, and the selector layer 12-3 may be implemented in a turned-on state or a turned-off state based on the threshold voltage. The selector layer 12-3 may include a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$, $VO_2$, or the like, or a tunneling insulating layer having a relatively wide band gap, such as $SiO_2$, $Al_2O_3$, or the like.

The variable resistance layer 12-7 may be a part that stores data in the first memory cell 12. To this end, the variable resistance layer 12-7 may have a variable resistance characteristic that switches between different resistance states according to an applied voltage. The variable resistance layer 12-7 may have a single-layer structure or a multilayer structure including at least one of materials used for an RRAM, a PRAM, an MRAM, an FRAM, or the like, that is, a metal oxide such as a perovskite-based oxide or a transition metal oxide, a phase change material such as a chalcogenide-based material, a ferromagnetic material, a ferroelectric material, or the like.

However, the layer structure of the first memory cell 12 is not limited thereto. When the first memory cell 12 is a variable resistance element, as long as the variable resistance layer 12-7 essential for data storage is included, the stacking order of the layers may be changed or at least one of the stacked layers may be omitted. As an example, one or more of the lower electrode layer 12-1, the selector layer 12-3, the intermediate electrode layer 12-5, and the upper electrode layer 12-9 may be omitted, or the positions of the selector layer 12-3 and the variable resistance layer 12-7 may be reversed with each other. Alternatively, one or more layers (not shown) may be added to the first memory cell 12 for process improvement or property improvement of the first memory cell 12.

Although not shown, the second memory cell 22 of FIG. 1A may also have the same layer structure as that of FIG. 1B.

Returning again to FIG. 1A, the first memory cell 12 may be driven by a voltage or current applied to the first lower line 11 and the first upper line 13, and the second memory cell 22 may be driven by a voltage or current applied to the second lower line 21 and the second upper line 23. Here, since the first upper line 13 and the second lower line 21 contact each other, they may have the same function. For example, when the first lower line 11 and the second upper line 23 function as word lines, the first upper line 13 and the second lower line 21 may function as a common bit line of the first stacked structure ST1 and the second stacked structure ST2. Alternatively, for example, when the first lower line 11 and the second upper line 23 function as bit lines, the first upper line 13 and the second lower line 21 may function as a common word line of the first stacked structure ST1 and the second stacked structure ST2. Although the embodiment shown in FIG. 1A shows the first upper line 13 and the second lower line 21 as two separate lines, embodiments of the present disclosure are not limited thereto. In other embodiments, these two lines 13 and 21 are substantially indistinguishable from each other to form a single integrated line functioning as a common bit line or a common word line.

Meanwhile, when manufacturing of the above-described memory device, an attack on the first stacked structure ST1 may occur in the process of forming the second stacked structure ST2. In the present disclosure, a method for reducing an attack on the first stacked structure ST1 and a problem resulting therefrom will be proposed as will be described below.

FIGS. 2A to 9B are views illustrating a memory device according to an embodiment of the present disclosure, and a method for fabricating the same. FIGS. 2A, 3A, 4A, 5A, 6A, 7A, 8A, and 9A are views based on a cross-section in the second direction of FIG. 1A, and FIGS. 2B, 3B, 4B, 5B, 6B, 7B, 8B, and 9B are views based on a cross-section in the first direction of FIG. 1A.

Hereinafter, the fabricating method will be described first.

Figure 2A:
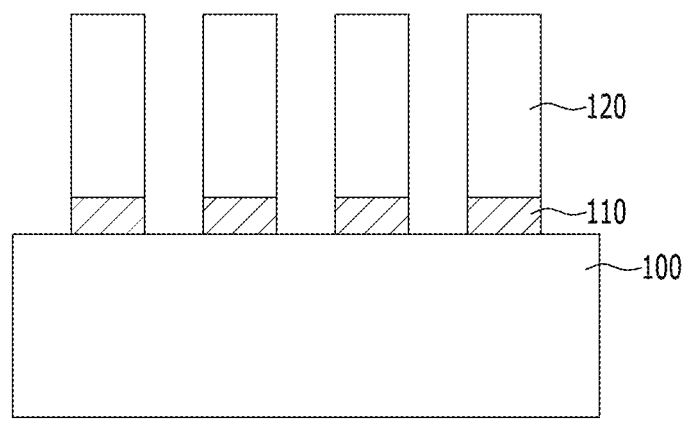
FIGS. 2A, 2B, 3A, 3B, 4A, 4B, 5A, 5B, 6A, 6B, 7A, 7B, 8A, 8B, 9A, and 9B are views illustrating a memory device according to an embodiment of the present disclosure, and a method for fabricating the same.
Figure 2B:
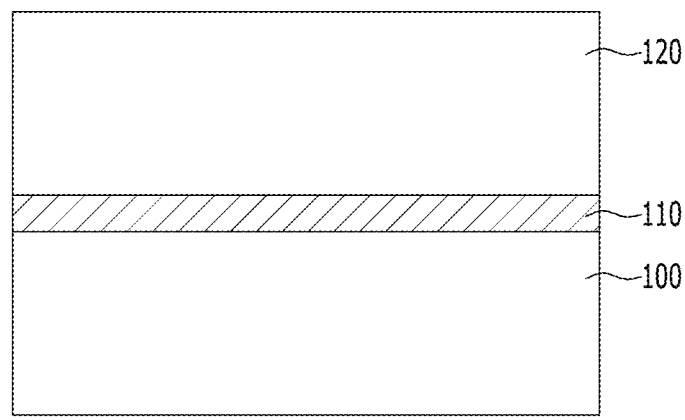

Referring to FIGS. 2A and 2B, a substrate 100 may be provided. The substrate 100 may include a semiconductor material such as silicon. In addition, a desired lower structure (not shown) may be formed in the substrate 100. For example, an integrated circuit for driving conductive lines to be described later may be formed in the substrate 100.

Subsequently, a stacked structure of a first lower line 110 and an initial first memory cell 120 may be formed over the substrate 100. The first lower line 110 and the initial first memory cell 120 may be formed by depositing a conductive layer for forming the first lower line 110 and a material layer for forming the initial first memory cell 120 over the substrate 100, and etching the conductive layer and the material layer using a line-shaped mask pattern (not shown) extending in the first direction as an etch barrier. The initial first memory cell 120 may have a multilayer structure, for example, as illustrated in FIG. 1B.

The stacked structure of the first lower line 110 and the initial first memory cell 120 may have a line shape extending in the first direction. A plurality of stacked structure of the first lower lines 110 and the initial first memory cells 120 may be arranged to be spaced apart from each other in the second direction.

Figure 3A:
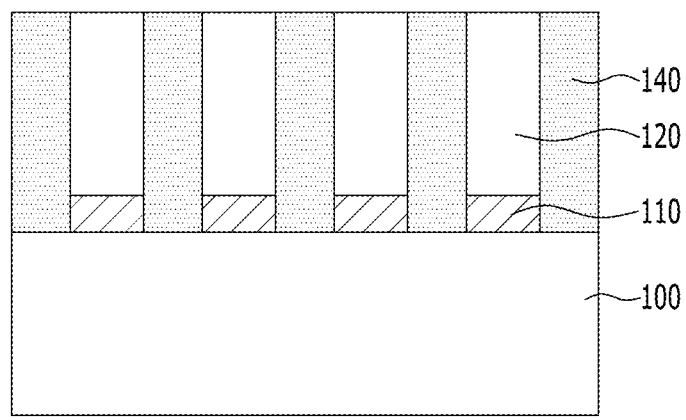
Figure 3B:
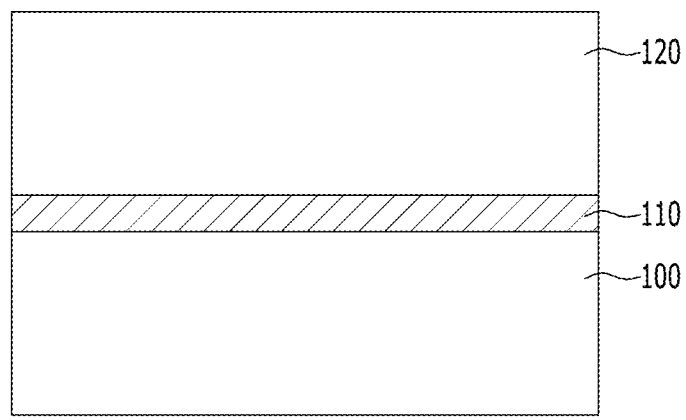

Referring to FIGS. 3A and 3B, a first interlayer insulating layer 140 filling a space between the stacked structures of the first lower lines 110 and the initial first memory cells 120 may be formed over the substrate 100.

The first interlayer insulating layer 140 is formed by forming an insulating material having a thickness sufficient to cover the stacked structure of the first lower line 110 and the initial first memory cell 120, over the substrate 100, and then performing a planarization process until the upper surface of initial first memory cell 120 is exposed.

The first interlayer insulating layer 140 may include various insulating materials. In particular, since the aspect ratio of the space between the stacked structures of the first lower lines 110 and the initial first memory cells 120 is large, a process and/or material having an excellent gap-fill characteristic may be used when forming the first interlayer insulating layer 140. As an example, the first interlayer insulating layer 140 may include a flowable material that may be formed by a method such as spin coating. The flowable material may be buried and then cured to form the first interlayer insulating layer 140. Alternatively, as an example, the first interlayer insulating layer 140 may be formed of a material having a low thermal conductivity, that is, a Low-K material, in order to sufficiently reduce heat transfer between first memory cells to be formed by patterning of the initial first memory cells 120. Alternatively, as an example, the first interlayer insulating layer 140 may include a material having a low thermal conductivity while being formed by a spin coating method, that is, a spin on Low-K (SOL) material. The SOL material may include SiOC and, in addition, may further include impurities such as hydrogen (H), nitrogen (N), or the like.

The planarization process may include a polishing process such as chemical mechanical polishing (CMP) or an etch-back process.

Figure 4A:
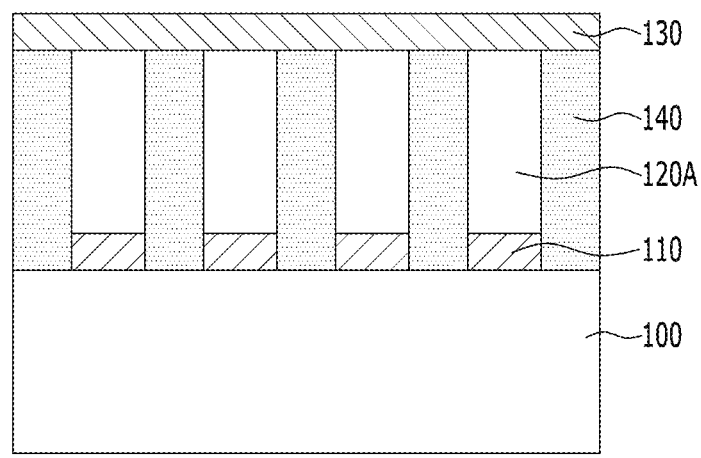
Figure 4B:
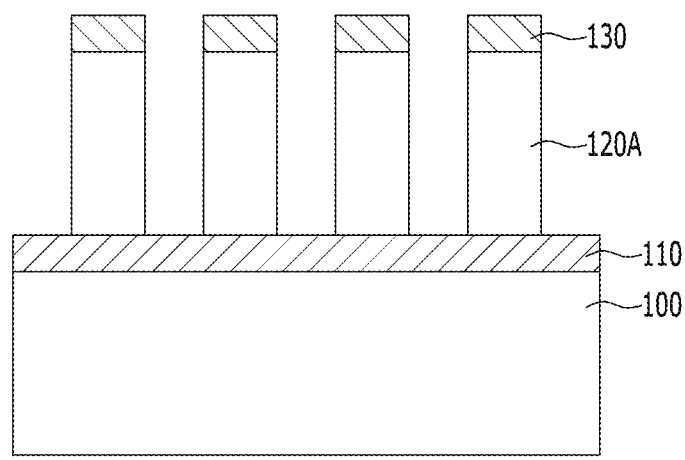

Referring to FIGS. 4A and 4B, a first upper line 130 may be formed over the initial first memory cell 120 and the first interlayer insulating layer 140, and then, a first memory cell 120A may formed by etching the initial first memory cell 120 exposed by the first upper line 130. The first memory cell 120A and the first upper line 130 may be formed by depositing a conductive layer for forming the first upper line 130 over the initial first memory cell 120 and the first interlayer insulating layer 140, etching the conductive layer using a line-shaped mask pattern (not shown) extending in the second direction as an etch barrier to form the first upper line 130, and etching the initial first memory cell 120 exposed by the first upper line 130.

The first upper line 130 may have a line shape extending in the second direction. A plurality of first upper lines 130 may be arranged to be spaced apart from each other in the first direction.

The first memory cell 120A may have an island shape in a plan view while being positioned at the intersection region of the first lower line 110 and the first upper line 130. A plurality of first memory cells 120A may be arranged in a matrix form along the first direction and the second direction. Both sidewalls of the first memory cell 120A in the first direction may be aligned with both sidewalls of the first upper line 130, and both sidewalls of the first memory cell 120A in the second direction may be aligned with both sidewalls of the first lower line 110.

Meanwhile, in the etching process of the first initial memory cell 120, the first interlayer insulating layer 140 exposed by the first upper line 130 may also be etched. The etched first interlayer insulating layers 140 may have a pillar shape that overlaps the first upper line 130 under the first upper line 130, and may be alternately arranged with the first memory cells 120A along the second direction.

Figure 5A:
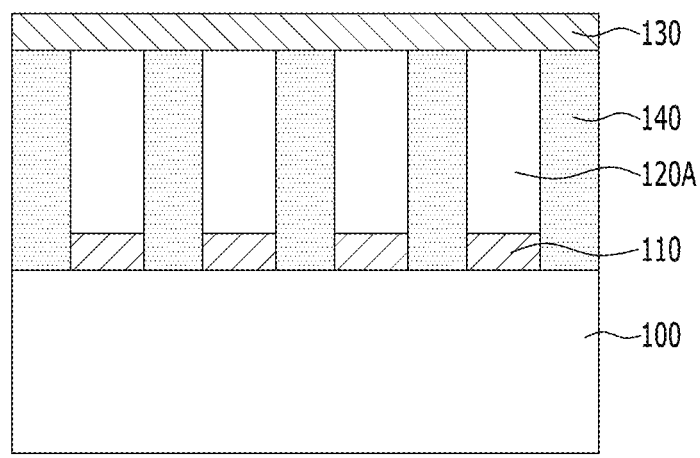
Figure 5B:
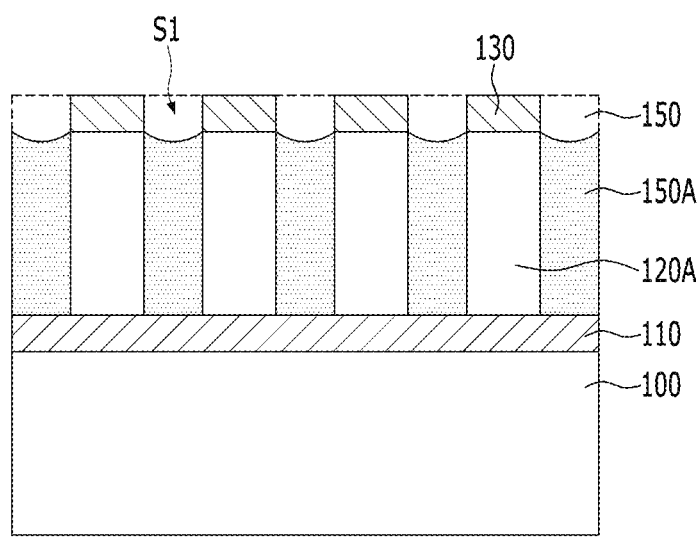

Referring to FIGS. 5A and 5B, a second interlayer insulating layer 150 filling a space between the first memory cells 120A, between the etched first interlayer insulating layers 140, and between the first upper lines 130, may be formed over the substrate 100.

The second interlayer insulating layer 150 may be formed by forming an insulating material having a thickness sufficient to cover the first upper line 130 over the substrate 100, and performing a planarization process until the upper surface of the first upper line 130 is exposed. The second interlayer insulating layer 150 may include various insulating materials. In particular, the second interlayer insulating layer 150 may be formed of the same material as the first interlayer insulating layer 140, for example, a SOL material. This may be for allowing the second interlayer insulating layer 150 to sufficiently fill the space between the first upper lines 130 and between the first memory cells 120A having a large aspect ratio, and reducing heat transfer that may be generated between the first memory cells 120A. The planarization process may include a polishing process such as CMP or an etch-back process.

The first interlayer insulating layer 140 and the second interlayer insulating layer 150 may be referred to as a first insulating layer. The first insulating layer may fill the space between the first memory cells 120A, between the first lower lines 110, and between the first upper lines 130.

Subsequently, a recess process for removing the upper portion of the second interlayer insulating layer 150 may be performed to form a second interlayer insulating layer pattern 150A. The first interlayer insulating layer 140 and the second interlayer insulating layer pattern 150A may be referred to as a first insulating layer pattern. Accordingly, the second interlayer insulating layer pattern 150A may have an upper surface lower than an upper surface of the second interlayer insulating layer 150. The upper surface of the second interlayer insulating layer pattern 150A may have a shape in which the center is depressed compared to the edge, but embodiments of the present disclosure are not limited thereto. The upper surface of the second interlayer insulating layer pattern 150A may be depressed to various degrees, or may be substantially flat. In the embodiment shown in FIG. 5B, the uppermost portion of the second interlayer insulating layer pattern 150A, for example, the edge of the upper surface of the second interlayer insulating layer pattern 150A, may be positioned at substantially the same level as the upper surface of the first memory cell 120A. However, embodiments of the present disclosure are not limited thereto, and the uppermost portion of the second interlayer insulating layer pattern 150A may be lowered or raised than the upper surface of the first memory cell 120A, at a level similar to the upper surface of the first memory cell 120A. If the second interlayer insulating layer pattern 150A is lowered excessively, the first memory cell 120A, particularly, the variable resistance layer and/or the selector layer of the first memory cell 120A may be exposed so that an attack on the variable resistance layer and/or the selector layer may occur in a subsequent process. However, if the second interlayer insulating layer pattern 150A is raised excessively, a space for forming a second insulating layer pattern (see 160A of FIGS. 8A and 8B), to be described later, may be insufficient. Accordingly, the uppermost portion of the second interlayer insulating layer pattern 150A may be positioned at a level the same as or similar to the upper surface of the first memory cell 120A. For example, when the distance from the substrate 100 (e.g., an upper surface of the substrate 100) to the upper surface of the first memory cell 120A is 1, the distance from the substrate 100 to the uppermost portion of the second interlayer insulating layer pattern 150A may have a value of 0.8 to 1.2.

This recessing process may be performed using a gas or plasma that is easy to remove the second interlayer insulating layer 150. For example, when the second interlayer insulating layer 150 includes a SOL material, the recess process may be performed in an atmosphere of a gas containing a halogen and a Group VIII inert gas, for example, He, or a plasma atmosphere of the gas.

A space created by this recess process, that is, a space defined by the upper surface of the second interlayer insulating layer pattern 150A and a side surface of the first upper line 130 will be hereinafter referred to as a first space S1. For example, the first space S1 may be defined by side surfaces of a pair of adjacent first upper lines 130 and an upper surface of the second interlayer insulating layer pattern 150A disposed between the adjacent first upper lines 130. The first space S1 may be for forming a second insulating layer pattern (see 160A in FIGS. 8A and 8B) to be described later. The reason for forming the first space S1 and the second insulating layer pattern will be described in more detail in the corresponding section. At least a portion of the side surface of the first upper line 130 may be exposed by the first space S1.

After the recess process, a cleaning process may be performed. The cleaning process may be for removing residues after the recess process, and may be performed using various cleaning solutions suitable for removing the residues. For example, if the residue includes SOL material, the cleaning process may be performed using a BOE solution in which $NH_4F$, HF, and $H_2O$ are mixed, ozone solution, IPA (Isopropanol, $CH_3CH_2CH_2OH$) solution, pure water (DI water), or a combination thereof.

Meanwhile, when the first upper line 130 includes tungsten (W), the surface of the first upper line 130 may have a hydrophilic property. However, in the above recess process and/or cleaning process, halogen radical ions, such as F radical ions, may combine with tungsten to form a W—X bond (here, X is a halogen), such as a W—F bond in the surface of the first upper line 130. When the W—X bond is formed, the surface of the first upper line 130 may have a hydrophobic property. That is, the surface of the first upper line 130 may be changed from hydrophilicity to hydrophobicity by the recess process and/or the cleaning process.

A subsequent process after the cleaning process may be to form the second insulating layer pattern (see 160A in FIGS. 8A and 8B) filling the first space S1 over the resultant structure of FIGS. 5A and 5B. Here, the second insulating layer pattern may include an insulating material having a higher etch resistance than the second interlayer insulating layer pattern 150A. In particular, the second insulating layer pattern may include an insulating material having a smaller loss due to etching than the second interlayer insulating layer pattern 150A during an etching process for forming a second lower line to be described later (see FIGS. 9A and 9B). As an example, the second insulating layer pattern may include ultra-low temperature oxide (ULTO). The ULTO may include $SiO_2$. The reason for forming the first space S1 and the second insulating layer pattern filling the first space S1 is as follows.

If an etching process for forming the second lower line is performed in a state in which the first space S1 and the second insulating layer pattern filling the first space S1 are not formed, that is, in a state in which the second interlayer insulating layer 150 is formed as in FIGS. 5A and 5B, the second interlayer insulating layer 150 having a low etching resistance may be lost. In this case, the sidewall of the first memory cell 120A may be exposed due to the loss of the second interlayer insulating layer 150, so that an attack on the first memory cell 120A may occur. On the other hand, as in the embodiment of FIGS. 8A and 8B, when the first space S1 between the first upper lines 130 is filled with the second insulating layer pattern 160A having a relatively high etching resistance, the second insulating layer pattern 160A may serve to withstand the etching process for forming the second lower line, so that the loss of the second interlayer insulating layer pattern 150A and the attack on the first memory cell 120A resulting therefrom may be prevented.

However, as described above, when the first upper line 130 contains tungsten and has a hydrophobic surface, a hydrophilic insulating material, for example, a hydrophilic ULTO layer may not be properly formed directly over the first upper line 130. This may be because the surface property of the first upper line 130 and the hydrophilic insulating material are different from each other, and thus, an adhesive property between the first line 130 and the hydrophilic insulating material may be deteriorated. When a gap occurs between the first upper line 130 and the hydrophilic insulating material due to deterioration of the adhesive property, the second interlayer insulating layer pattern 150A thereunder may be exposed, so that a problem in which the second interlayer insulating layer pattern 150A is lost during the etching process for forming the second lower line and an attack to the first memory cell 120A occurs may still exist. Accordingly, in an embodiment of the present disclosure, the second insulating layer pattern may be formed through the processes of FIGS. 6A to 7B below in order to improve the adhesive property.

Figure 6A:
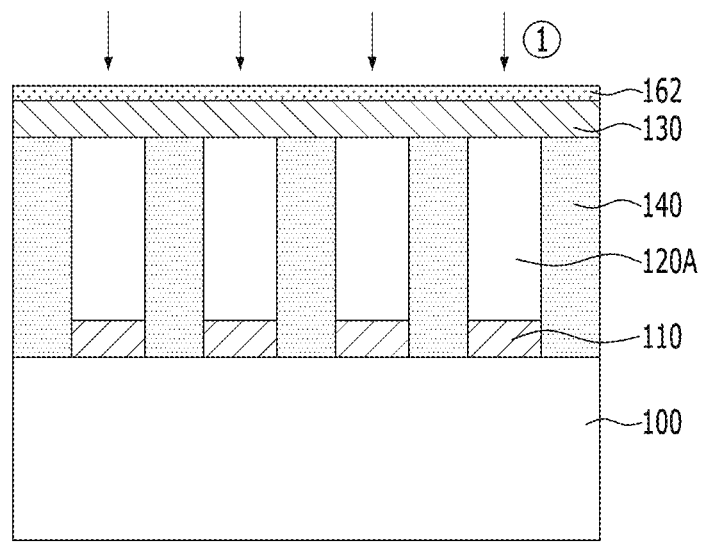
Figure 6B:
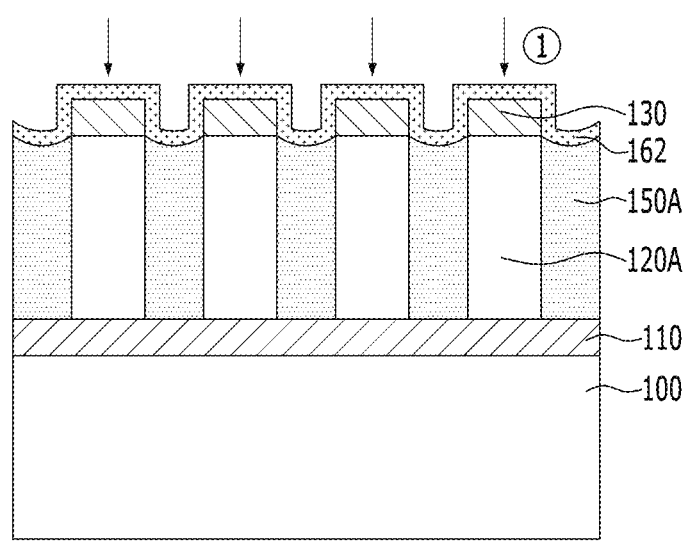

Referring to FIGS. 6A and 6B, a first portion 162 of the second insulating layer 160 (or a partial second insulating layer 162) may be formed along a lower profile over the resultant structure of FIGS. 5A and 5B.

The partial second insulating layer 162 may be a hydrophilic insulating layer having a higher etch resistance than the second interlayer insulating layer pattern 150A. For example, the partial second insulating layer 162 may include a ULTO layer.

Subsequently, a plasma treatment may be performed (refer to arrow ①) using a Group VIII inert gas, for example, helium (He) on the resultant structure in which the partial second insulating layer 162 is formed. In this case, an adhesive property between the partial second insulating layer 162 and the first upper line 130 may be improved, so that the gap between the first upper line 130 and the partial second insulating layer 162 may be reduced. Without wishing to be limited by theory, this may be because, when the plasma treatment is performed with a Group VIII inert gas such as helium, the hydrophobic surface of the first upper line 130 may be changed back to be hydrophilic, tungsten oxide improving the adhesion property is formed at the interface between the partial second insulating layer 162 and the first upper line 130, and the surface roughness of the first upper line 130 is increased. This has been confirmed by various experimental results, and will be described later with reference to FIGS. 10 to 12.

The partial second insulating layer 162 may be formed to have a relatively thin thickness that does not completely fill the first space S1. For example, the partial second insulating layer 162 may be formed to a thickness of several to several tens of Å. The plasma treatment may be performed after forming the partial second insulating layer 162 to a thin thickness to minimize particles that may be generated by the plasma treatment.

Figure 7A:
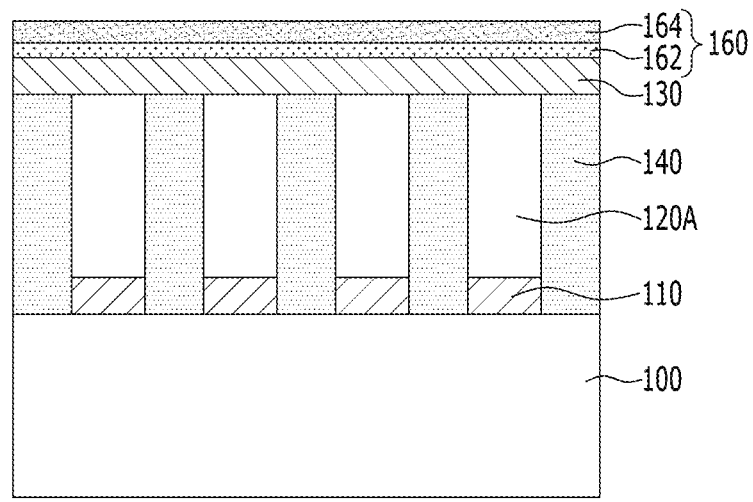
Figure 7B:
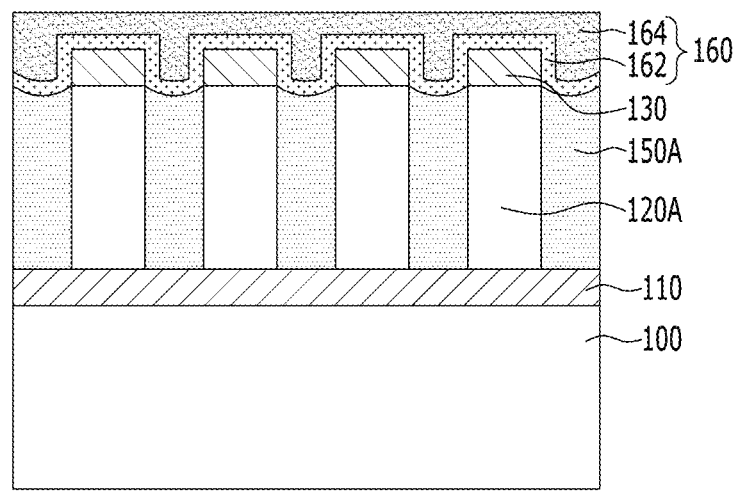

Referring to FIGS. 7A and 7B, a second portion 164 of the second insulating layer 160 (e.g., a remaining second insulating layer 164) may be formed over the partial second insulating layer 162 to a thickness sufficient to fill the first space S1. That is, a sum of the first thickness of the first portion 162 of the second insulating layer 160 and the second thickness of the second portion 164 of the second insulating layer 160 may be sufficient to substantially completely fill the first space S1. The thickness of the remaining second insulating layer 164 may be greater than the thickness of the partial second insulating layer 162. For example, the thickness of the partial second insulating layer 162 positioned over the upper surface of the first upper line 130 may be smaller than the thickness of the remaining second insulating layer 164. The remaining second insulating layer 164 may include the same layer as the partial second insulating layer 162, for example, a ULTO layer.

Accordingly, the second insulating layer 160 including the partial second insulating layer 162 and the remaining second insulating layer 164 may be formed. The partial second insulating layer 162 and the remaining second insulating layer 164 may be integrated and may not be distinguished from each other. The second insulating layer 160 may include an insulating material having a higher etch resistance than the second interlayer insulating layer pattern 150A, for example, ULTO. Since the second insulating layer 160 has an excellent adhesion property to the first upper line 130, the gap between the second insulating layer 160 and the first upper line 130 may be reduced or prevented.

Figure 8A:
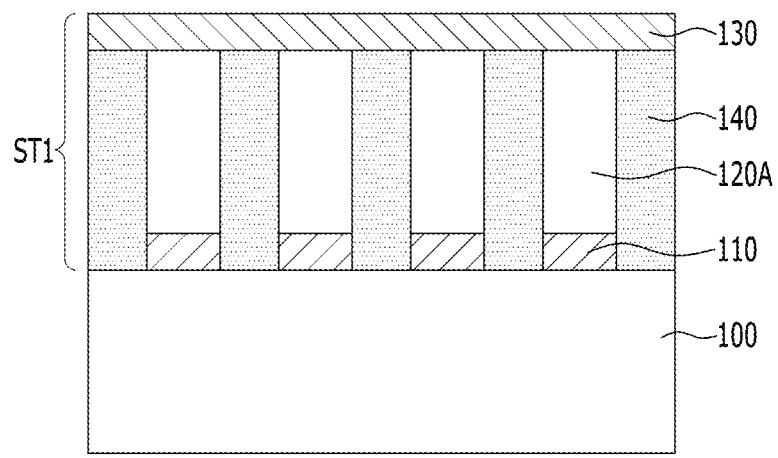
Figure 8B:
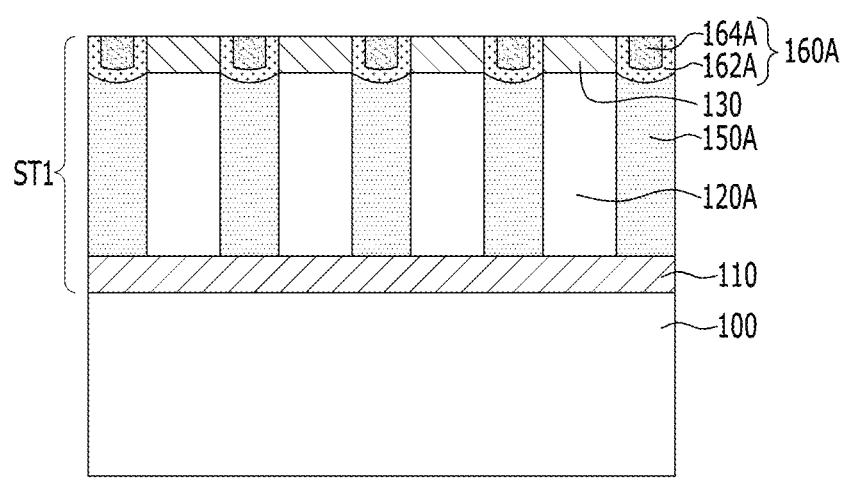

Referring to FIGS. 8A and 8B, the second insulating layer pattern 160A may be formed by performing a planarization process on the second insulating layer 160 to expose the upper surface of the first upper line 130. The planarization process may include a polishing process such as CMP or an etch-back process.

The second insulating layer pattern 160A may be filled in the first space S1 between the first upper lines 130, and may have a substantially flat upper surface with the upper surface of the first upper line 130. The second insulating layer pattern 160A may include a partial second insulating layer pattern 162A and a remaining second insulating layer pattern 164A.

Accordingly, the first stacked structure ST1 including the first lower line 110, the first upper line 130, and the first memory cell 120A therebetween may be formed over the substrate 100. The first stacked structure ST1 may substantially correspond to the above-described first stacked structure ST1 of FIG. 1A. Here, the first interlayer insulating layer 140 extending in the first direction to have a line shape may exist between the first lower lines 110. The first interlayer insulating layer 140 and the second interlayer insulating layer pattern 150A may exist between the first memory cells 120A. The first interlayer insulating layer 140 may have a pillar shape that is interposed between the first memory cells 120A in the second direction and alternately arranged with the first memory cells 120A. The second interlayer insulating layer pattern 150A may have a line shape extending in the second direction while being interposed between the first memory cells 120A in the first direction. The first interlayer insulating layer 140 and the second interlayer insulating layer pattern 150A may include a material having an excellent gap-fill characteristic and low thermal conductivity, for example, a SOL material, and thus, the first interlayer insulating layer 140 and the second interlayer insulating layer pattern 150A may be easily filled in a space between the first memory cells 120A and thermal interference between the first memory cells 120A may be reduced/prevented. The second insulating layer pattern 160A may exist between the first upper lines 130. The second insulating layer pattern 160A may be positioned over the second interlayer insulating layer pattern 150A to cover the second interlayer insulating layer pattern 150A, and may have a line shape extending in the second direction. The second insulating layer pattern 160A may include an insulating material having a higher etch resistance than the first interlayer insulating layer 140 and/or the second interlayer insulating layer pattern 150A, for example, ULTO.

Figure 9A:
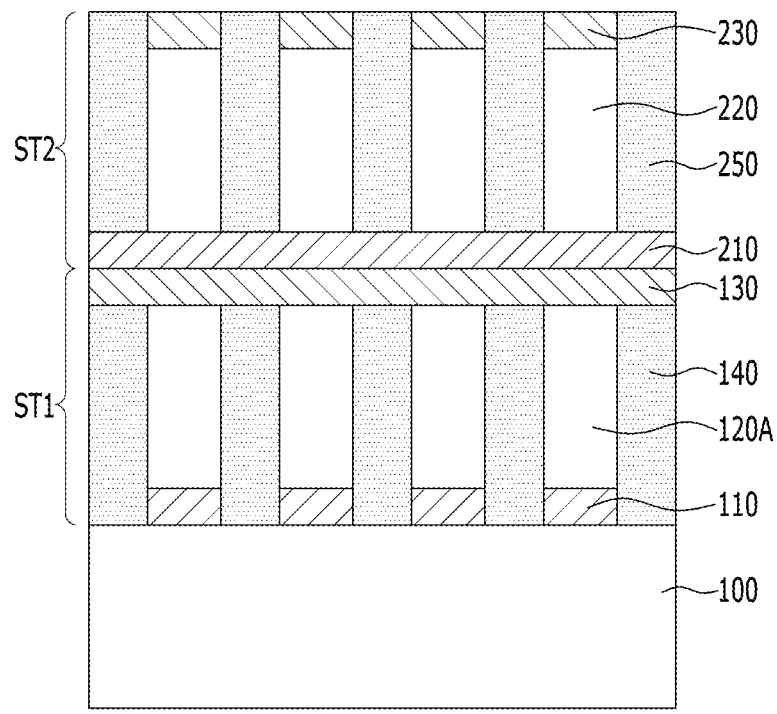
Figure 9B:
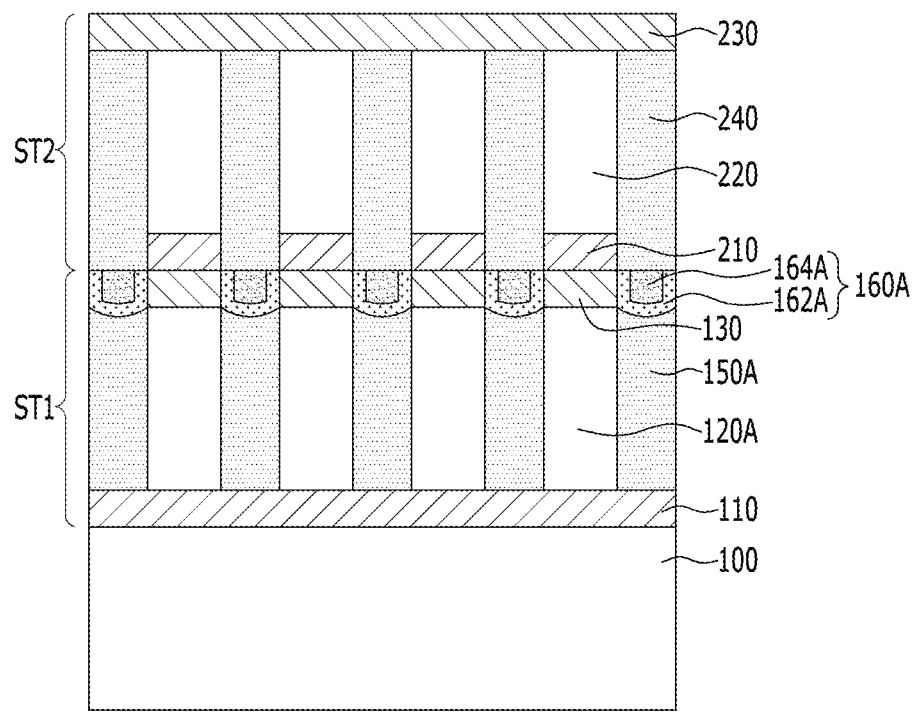

Referring to FIGS. 9A and 9B, a second stacked structure ST2 may be formed over the first stacked structure ST1. The second stacked structure ST2 may substantially correspond to the second stacked structure ST2 of FIG. 1A.

Since the process of forming the second stacked structure ST2 is similar to the process of forming the first stacked structure ST1 described above, it will be briefly described.

First, a stacked structure of a second lower line 210 and an initial second memory cell may be formed over the first stacked structure. The stacked structure of the second lower line 210 and the initial second memory cell may overlap the first upper line 130 and extending in the same direction. The stacked structure of the second lower line 210 and the initial second memory cell may be formed by depositing a conductive layer for forming the second lower line 210 and a material layer for forming the initial second memory cell over the first stacked structure ST1, and etching the conductive layer and the material layer using a line-shaped mask pattern (not shown) extending in the second direction as an etch barrier. In this case, during the etching of the conductive layer for forming the second lower line 210, the second insulating layer pattern 160A of the first stacked structure ST1 may be exposed. However, as described above, since the second insulating layer pattern 160A has a high etch resistance, the loss of the second interlayer insulating layer pattern 150A under the second insulating layer pattern 160A may be prevented or reduced, and thus, an attack on the first memory cell 120A may be prevented.

Subsequently, a fourth insulating layer 240 may be filled between the stacked structures of the second lower lines 210 and the initial second memory cells. The fourth insulating layer 240 may include substantially the same insulating material as the first interlayer insulating layer 140 and/or the second interlayer insulating layer pattern 150A.

Subsequently, a second upper line 230 and a second memory cell 220 may be formed by depositing a conductive layer for forming the second upper line 230 over the initial second memory cell and the fourth insulating layer 240, and etching the conductive layer and the initial second memory cell using a line-shaped mask pattern (not shown) extending in the first direction as an etch barrier.

Subsequently, a fifth insulating layer 250 filled between the second memory cells 220 and between the second upper lines 230 may be formed. The fifth insulating layer 250 may include substantially the same insulating material as the first interlayer insulating layer 140 and/or the second interlayer insulating layer pattern 150A.

Accordingly, the memory device in which the first stacked structure ST1 and the second stacked structure ST2 are sequentially formed over the substrate 100 may be manufactured.

In the present embodiment, the memory device including the two stacked structures ST1 and ST2 has been described, but embodiments of the present disclosure are not limited thereto. In another embodiment, three or more stacked structures may be formed. In this case, in order to prevent an upper stacked structure from applying an attack to a lower stacked structure formed thereunder, the processes of FIGS. 5A to 8B may be performed when forming the lower stacked structure. For example, when a third stacked structure is formed over the resultant structure of FIGS. 9A and 9B, the fifth insulating layer 250 may be recessed and the recessed space may be filled with an insulating material having a higher etch resistance, for example, ULTO, before the third stacked structure is formed.

Meanwhile, it has already been described that the adhesive property between the second insulating layer 160 and the first upper line 130 is increased when the partial second insulating layer 162 including a ULTO layer is formed to a thin thickness over the first upper line 130 containing tungsten and having the hydrophobic surface, the plasma treatment is performed on the partial second insulating layer 162 with a Group VIII inert gas such as helium, and then the remaining second insulating layer 164 including the ULTO layer is formed. Various experimental results showing these will be described below with reference to FIGS. 10, 11, and 12.

Figure 10:
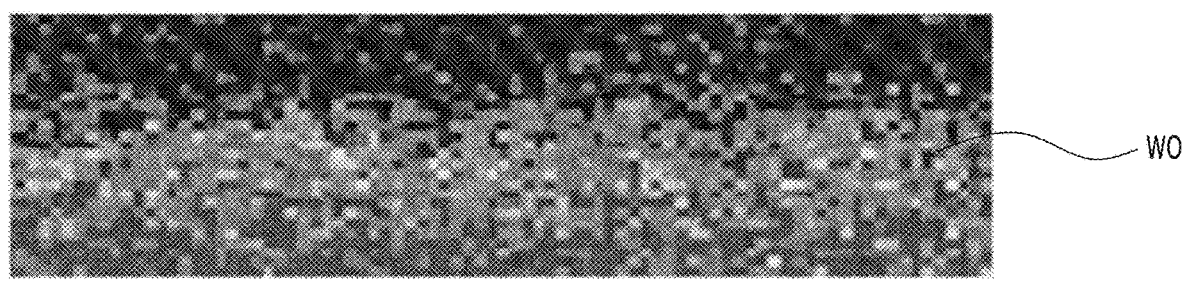
FIG. 10 is an EELS mapping result showing that a tungsten oxide layer is formed at an interface between a tungsten layer and a ULTO layer according to an embodiment.

FIG. 10 is an EELS mapping result showing that a tungsten oxide layer is formed at an interface between a tungsten layer and a ULTO layer according to an embodiment. For reference, FIG. 10 shows an EELS mapping result of a case in which a tungsten layer with a thickness of about 600 Å is deposited on a substrate by a physical vapor deposition (PVD) method, a recess and cleaning process is performed to the tungsten layer, a first ULTO layer with a thickness of about 30 Å is deposited by an atomic layer deposition (ALD) method, helium plasma treatment is performed, and a second ULTO layer with a thickness of about 375 Å is additionally deposited by the ALD method. Here, the tungsten layer may correspond to the first upper line 130, the first ULTO layer may correspond to the partial second insulating layer 162, and the second ULTO layer may correspond to the remaining second insulating layer 164.

Referring to FIG. 10, it may be seen that a tungsten oxide layer WO (see dark gray shade) is uniformly formed between the lower tungsten layer and the upper ULTO layer.

The presence of such tungsten oxide may increase the adhesion property between the tungsten layer and the ULTO layer.

Figure 11:
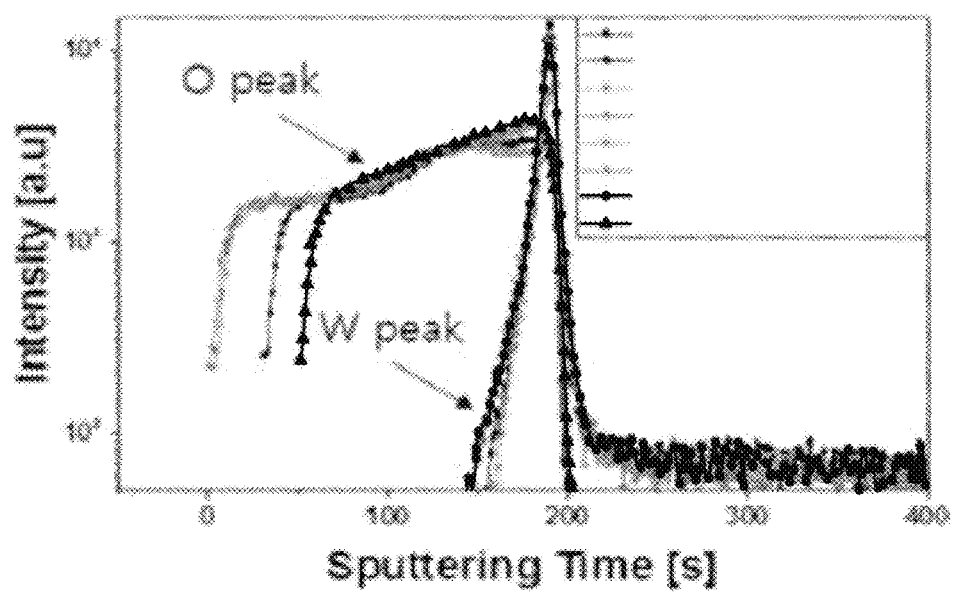
FIG. 11 is a SIMS analysis result showing that a tungsten oxide layer is formed at an interface between a tungsten layer and a ULTO layer according to an embodiment.

FIG. 11 is a SIMS analysis result showing that a tungsten oxide layer is formed at an interface between a tungsten layer and a ULTO layer in the present embodiment. For reference, FIG. 11 relates to the experimental result described in FIG. 10 and a comparative example. The comparative example shows a process result obtained by depositing a tungsten layer on a substrate, exposing the tungsten layer to a condition in which a recess and cleaning process is performed, and depositing a ULTO layer with a thickness of about 400 Å on the tungsten layer. That is, when the partial deposition of the ULTO layer and the helium plasma treatment are omitted from the experimental result of FIG. 10, the process result of the comparative example may be obtained.

In FIG. 11, the black line, that is, the two bottommost lines in the square, shows the SIMS analysis result for the experimental result of FIG. 10. The other lines are SIMS analysis results for the comparative example or SIMS analysis results for the case of using plasma of another gas instead of helium.

Referring to FIG. 11, it may be seen that the intensity of oxygen is the largest in the present embodiment. That is, it may be seen that the degree of formation of tungsten oxide is the greatest in the embodiment using plasma of helium.

The presence of such tungsten oxide may increase the adhesion property between the tungsten layer and the ULTO layer.

FIG. 12 is a view showing a change in a surface property of a tungsten layer according to an embodiment.

Referring to FIG. 12, it may be seen that immediately after the deposition of the tungsten layer, the contact angle is 10 degrees or less and the surface of the tungsten layer is very hydrophilic.

After the tungsten layer is exposed to the condition of the recess and cleaning process, it may be seen that the contact angle is changed to 73.3 degrees, which indicates that the surface of the tungsten layer is hydrophobic.

When the tungsten layer having a hydrophobic surface is treated with helium plasma, it may be seen that the contact angle is changed to 17.4 degrees, which indicates that the surface of the tungsten layer becomes hydrophilic again.

That is, the tungsten layer of this embodiment may finally have a hydrophilic surface, thereby improving the adhesion property with the hydrophilic ULTO layer.

In addition, in the experimental result described in FIG. 10, the measured surface roughness of the tungsten layer was about 6.8 Å, whereas, in the comparative example, the measured surface roughness of the tungsten layer was about 4.3 Å.

When the surface roughness is increased, the adhesion property to the layer adhering to the surface may be improved, and as a result, the adhesion property between the tungsten layer and the ULTO layer may be improved.

According to the above embodiments of the present disclosure, it may be possible to facilitate fabricating processes and preventing and/or reducing damage to a memory cell.

Although various embodiments have been described for illustrative purposes, it will be apparent to those skilled in the art that various changes and modifications may be possible.

What is claimed is:

1. A method for fabricating a semiconductor device, the method comprising:
providing a substrate;
forming a first stacked structure over the substrate, the first stacked structure including a plurality of first lower lines extending in a first direction, a plurality of first upper lines disposed over the first lower lines and extending in a second direction intersecting the first direction, and a plurality of first memory cells respectively disposed at intersection regions between the first lower lines and the first upper lines;
forming a first insulating layer filled between the first memory cells and between the first upper lines;
forming a first space by recessing the first insulating layer to expose side surfaces of the first upper lines; and
forming a second insulating layer having a higher etch resistance than the first insulating layer while filling the first space.

2. The method according to claim 1, wherein the first upper line includes tungsten, and
wherein the forming of the second insulating layer includes:
forming a first portion of the second insulating layer;
performing plasma treatment using a Group VIII inert gas; and
forming a second portion of the second insulating layer over the first portion of the second insulating layer.

3. The method according to claim 2, wherein the first portion of the second insulating layer is formed to have a first thickness that does not completely fill the first space, and
wherein the second portion of the second insulating layer is formed to have a second thickness, a sum of the first thickness and the second thickness being sufficient to completely fill the first space.

4. The method according to claim 3, wherein the first thickness is smaller than the second thickness.

5. The method according to claim 2, wherein the second insulating layer has hydrophilicity,
wherein, during the recessing, a first hydrophilic surface of the first upper line changes to a hydrophobic surface, and
wherein, during the plasma treatment, the hydrophobic surface of the first upper line changes to a second hydrophilic surface.

6. The method according to claim 2, wherein tungsten oxide is formed between the first upper line and the second insulating layer.

7. The method according to claim 2, wherein, during the plasma treatment, a surface roughness of the first upper line is increased compared to that of the first upper line before the plasma treatment.

8. The method according to claim 2, wherein the second insulating layer includes an ultra-low temperature oxide (ULTO) layer.

9. The method according to claim 2, further comprising:
performing a cleaning process, after the forming of the first space, and
wherein the second insulating layer has hydrophilicity,
wherein, during the cleaning process, a first hydrophilic surface of the first upper line changes to a hydrophobic surface, and
wherein, during the plasma treatment, the hydrophobic surface of the first upper line changes to a second hydrophilic surface.

10. The method according to claim 1, further comprising:
forming a second stacked structure over the first stacked structure, the second stacked structure including a plurality of second lower lines extending in the second direction while contacting the first upper lines, respectively, a plurality of second upper lines disposed over the second lower lines and extending in the first direction, and a plurality of second memory cells disposed at intersection regions between the second lower lines and the second upper lines.

11. A method for fabricating a semiconductor device, comprising:
forming a tungsten layer;
converting a first hydrophilic surface of the tungsten layer into a hydrophobic surface;
forming a first portion of an ultra-low temperature oxide (ULTO) layer over the tungsten layer;

performing plasma treatment to the first portion of the ULTO layer using a group VIII inert gas; and forming a second portion of the ULTO layer.

12. The method according to claim 11, wherein the first hydrophilic surface of the tungsten layer is converted into the hydrophobic surface by a process including halogen radical ions.

13. The method according to claim 11, wherein a first thickness of the first portion of the ULTO layer is smaller than a second thickness of the second portion of the ULTO layer.

14. The method according to claim 11, wherein, during the plasma treatment, the hydrophobic surface of the tungsten layer is converted into a second hydrophilic surface.

15. The method according to claim 11, wherein tungsten oxide is formed between the tungsten layer and the first portion of the ULTO layer.

16. The method according to claim 11, wherein, during the plasma treatment, a surface roughness of the tungsten layer is increased compared to that of the tungsten layer before the plasma treatment.

* * * * *